(12) United States Patent
Taketomi et al.

(10) Patent No.: US 9,892,891 B2
(45) Date of Patent: Feb. 13, 2018

(54) LI-CONTAINING PHOSPHORIC-ACID COMPOUND SINTERED BODY AND SPUTTERING TARGET, AND METHOD FOR MANUFACTURING SAID LI-CONTAINING PHOSPHORIC-ACID COMPOUND SINTERED BODY

(71) Applicant: KOBELCO RESEARCH INSTITUTE, INC., Kobe-shi (JP)

(72) Inventors: Yuichi Taketomi, Takasago (JP); Yuki Tao, Takasago (JP); Moriyoshi Kanamaru, Takasago (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 721 days.

(21) Appl. No.: 14/386,950

(22) PCT Filed: Apr. 10, 2013

(86) PCT No.: PCT/JP2013/060777
§ 371 (c)(1),
(2) Date: Sep. 22, 2014

(87) PCT Pub. No.: WO2013/154118
PCT Pub. Date: Oct. 17, 2013

(65) Prior Publication Data
US 2015/0041312 A1 Feb. 12, 2015

(30) Foreign Application Priority Data
Apr. 11, 2012 (JP) .................................. 2012-090543

(51) Int. Cl.
| C23C 14/34 | (2006.01) |
| H01J 37/34 | (2006.01) |
| C04B 35/447 | (2006.01) |
| C04B 35/645 | (2006.01) |
| H01M 10/052 | (2010.01) |
| H01M 10/0562 | (2010.01) |
| C01D 15/00 | (2006.01) |
| C04B 35/626 | (2006.01) |

(52) U.S. Cl.
CPC .......... *H01J 37/3429* (2013.01); *C01D 15/00* (2013.01); *C04B 35/447* (2013.01); *C04B 35/62605* (2013.01); *C04B 35/645* (2013.01); *C23C 14/3414* (2013.01); *H01M 10/052* (2013.01); *H01M 10/0562* (2013.01); *C04B 2235/3203* (2013.01); *C04B 2235/5436* (2013.01); *C04B 2235/658* (2013.01); *C04B 2235/72* (2013.01); *C04B 2235/76* (2013.01); *C04B 2235/77* (2013.01); *C04B 2235/786* (2013.01); *C04B 2235/80* (2013.01); *C04B 2235/81* (2013.01); *H01J 2237/332* (2013.01)

(58) Field of Classification Search
CPC .... H01J 37/3429; C01D 15/00; C04B 35/447; C04B 35/62605; C04B 35/35; C04B 35/645; C23C 14/3414
See application file for complete search history.

(56) References Cited

U.S. PATENT DOCUMENTS

| 5,338,625 A | 8/1994 | Bates et al. |
| 5,455,126 A | 10/1995 | Bates et al. |
| 5,512,147 A | 4/1996 | Bates et al. |
| 5,567,210 A | 10/1996 | Bates et al. |
| 5,597,660 A | 1/1997 | Bates et al. |
| 6,218,049 B1 | 4/2001 | Bates et al. |
| 8,197,781 B2 * | 6/2012 | Neudecker .............. C23C 14/06 117/941 |
| 2008/0173542 A1 | 7/2008 | Neudecker et al. |
| 2008/0222881 A1 | 9/2008 | Yu et al. |
| 2009/0045053 A1 | 2/2009 | Kim et al. |
| 2012/0079712 A1 | 4/2012 | Yu et al. |
| 2013/0064352 A1 | 3/2013 | Kubo et al. |
| 2013/0137010 A1 | 5/2013 | Aitken et al. |

FOREIGN PATENT DOCUMENTS

| CN | 101857215 A | 10/2010 |
| CN | 102206802 A | 10/2011 |
| CN | 102249661 A | 11/2011 |
| EP | 2 039 665 A2 | 3/2009 |
| EP | 2 786 440 | 10/2014 |
| JP | 2009-32656 A | 2/2009 |
| JP | 2009-46340 | 3/2009 |
| JP | 2013-57879 | 3/2013 |
| KR | 2002-0007881 | 1/2002 |
| WO | WO 2008/058171 A2 | 5/2008 |
| WO | WO 2010/041598 A1 | 4/2010 |
| WO | WO 2013/082231 A1 | 6/2013 |

OTHER PUBLICATIONS

International Search Report dated Jul. 16, 2013, in PCT/JP13/60777 filed Apr. 10, 2013.

(Continued)

*Primary Examiner* — John Brayton
(74) *Attorney, Agent, or Firm* — Oblon, McClelland, Maier & Neustadt, L.L.P.

(57) ABSTRACT

Provided is a Li-containing phosphoric-acid compound sintered body of both high relative density and very small crystal grain diameter with reduced incidence of defects (voids) such as air holes, the Li-containing phosphoric-acid compound sintered body causing a Li-containing phosphoric-acid compound thin film useful as a solid electrolyte for a secondary cell or the like to be stabilized without any incidence of target cracking or irregular electrical discharge, and offering high-speed film-forming capability. This Li-containing phosphoric-acid compound sintered body contains no defects measuring 50 μm or larger within a 1 mm$^2$ cross-sectional region in the interior thereof, while having an average crystal grain diameter of no more than 15 μm and a relative density of at least 85%.

11 Claims, No Drawings

(56) References Cited

OTHER PUBLICATIONS

Park, et al., "Effects of sputtering pressure on the characteristics of lithium ion conductive lithium phosphorous oxynitride thin film", Journal of Electroceramics, vol. 17, 2006, pp. 1023-1030.
Suzuki, et al., A lithium phosphorous oxynitride (LiPON) film sputtered from unsintered $Li_3PO_4$ powder target, Solid State Ionics, vol. 191, 2011, pp. 49-54.
Written Opinion of the International Searching Authority dated Jul. 16, 2013, in PCT/JP13/60777 filed Apr. 10, 2013.
Extended European Search Report dated Oct. 12, 2015 in Patent Application No. 13776280.3.

* cited by examiner

LI-CONTAINING PHOSPHORIC-ACID COMPOUND SINTERED BODY AND SPUTTERING TARGET, AND METHOD FOR MANUFACTURING SAID LI-CONTAINING PHOSPHORIC-ACID COMPOUND SINTERED BODY

TECHNICAL FIELD

The present invention relates to a Li-containing phosphoric-acid compound sintered body used at the time of using a sputtering method to form a Li-containing phosphoric-acid compound thin film useful as a solid electrolytic substance for, for example, an all-solid-state secondary battery; and a sputtering target. The invention relates specifically to a Li-containing phosphoric-acid compound sintered body and a sputtering target each making it possible to form the above-mentioned thin film stably at a high film-forming speed by a sputtering method; and a method for manufacturing this Li-containing phosphoric-acid compound sintered body.

BACKGROUND ART

An all-solid-state thin film lithium secondary battery (hereinafter referred to as a "Li-based thin film secondary battery") is used in various devices such as a thin film solar battery, a thin film thermoelectric element, and a radio electric-charging element. About Li-based thin film secondary batteries, a demand therefor has been rapidly increasing. The Li-based thin film secondary batteries are each typically composed of a positive electrode made of a Li-containing transition metal oxide thin film containing Li and a transition metal, a solid electrolyte made of a Li-containing phosphoric-acid compound thin film, and a negative electrode made of a Li metal thin film.

For the formation of the Li-containing phosphoric-acid compound thin film, a sputtering method is preferably used in which a sputtering target (hereinafter abbreviated also to a target) made of substantially the same raw material as constitutes the film is sputtered. The sputtering method has advantages that conditions for the film formation are easily adjusted, and the film can easily be formed on a semiconductor substrate.

About this sputtering target, for example, Patent Literature 1 discloses a target obtained to have a relative density of 90% or more and shows a reduced proportion of a $Li_4P_2O_7$ phase as an impurity phase by performing CIP (cold isostatic pressing) and HIP (hot isostatic pressing) successively.

Patent Literature 2 discloses a manufacturing method of pre-sintering a powder of fine $Li_3PO_4$ particles containing water to decrease the water content by percentage in the $Li_3PO_4$ particle powder, and then sintering the powder. According to this manufacturing method, a sintered body can be obtained in which the formation of defects (voids) such as pores is restrained.

CITATION LIST

Patent Literatures

[Patent Literature 1] US 2008/0173542 A1
[Patent Literature 2] Japanese Patent No. 4843582

SUMMARY OF INVENTION

Technical Problem

However, when a film is formed by sputtering, abnormal discharge (arcing), or a discharge mark based on arc discharge is generated. Thus, a stable discharge cannot be attained to cause problems that during the sputtering, the target is cracked and nodules are generated.

In light of the above-mentioned situation, the present invention has been made. An object of the present invention is to provide a Li-containing phosphoric-acid compound sintered body making it possible to form a Li-containing phosphoric-acid compound thin film, which is useful for a solid electrolyte of a Li-based thin film secondary battery or the like, at a high film-forming speed stably without generating abnormal discharge (and further a target using this sintered body); and a method for manufacturing this sintered body. Specifically, an object thereof is to provide a Li-containing phosphoric-acid compound sintered body which has both of a high relative density and a fine crystal grain diameter and which is restrained in the generation of pores and other defects (voids) inside the body; a Li-containing phosphoric-acid compound target; and a method for manufacturing the sintered body. Another object thereof is more preferably to provide the sintered body and the target in each of which an impurity phase ($Li_4P_2O_7$ phase) is decreased, and a method for manufacturing the sintered body.

Solution to Problem

The Li-containing phosphoric-acid compound sintered body of the present invention, which has solved the above-mentioned problems, has a subject matter of a sintered body which contains no defects having a size of 50 μm or more in any region having a cross section having an area of 1 mm² inside the body, has an average crystal grain diameter of 15 μm or less, and has a relative density of 85% or more.

A desired embodiment thereof is an embodiment in which the intensity ratio of the diffraction intensity (P314) of a (011) plane of a $Li_3PO_4$ phase in the sintered body according to powder X-ray diffraction to the diffraction intensity (P427) of a (1-11) plane of a $Li_4P_2O_7$ phase in the sintered body according to the same, P314/P427, satisfies the following: P314/P427≥1.1.

The present invention also includes a sputtering target obtained using the above-mentioned Li-containing phosphoric-acid compound sintered body.

The present invention also has a subject matter of a method for manufacturing the above-mentioned Li-containing phosphoric-acid compound sintered body, wherein: a raw material containing a Li-containing phosphoric-acid compound having an average grain diameter of 10 μm or less is introduced into a hot press furnace without being pre-sintered while the raw material is retained in an atmosphere having a dew point of −30° C. or lower; and then the raw material is sintered by a hot press method.

A desired embodiment thereof is an embodiment in which the sintering by the hot press method is performed in a vacuum or an inert atmosphere at a hot press temperature of 700 to 1000° C. under a pressure of 10 to 100 MPa.

Advantageous Effects of Invention

The present invention can provide a Li-containing phosphoric-acid compound sintered body and a Li-containing phosphoric-acid compound target which have both of a high relative density and a fine crystal grain diameter, are restrained in the generation of defects therein, and are further decreased in the proportion of an impurity phase ($Li_4P_2O_7$ phase) therein. Accordingly, a Li-containing phosphoric-acid compound thin film useful for a solid electrolyte can be formed stably at a high film-forming speed without causing abnormal discharge nor other inconveniences.

DESCRIPTION OF EMBODIMENTS

The inventors have repeatedly made investigations to provide a Li-containing phosphoric-acid compound sintered body and a Li-containing phosphoric-acid compound target (hereinafter referred to also as a target) which have both of a high relative density and a fine crystal grain diameter, are restrained in the generation of defects therein, and are further decreased in the proportion of an impurity phase ($Li_4P_2O_7$ phase) therein.

As a result, the inventors have found out that the intended object is attained by: using a raw material containing a Li-containing phosphoric-acid compound having an average particle diameter of 10 μm or less; introducing the raw material into a hot press furnace without pre-sintering the raw material while retaining the raw material in an atmosphere having a dew point of −30° C. or lower; and sintering, after the introduction, the raw material (for example, at a temperature of 700 to 1000° C. under a pressure of 10 to 100 MPa in a vacuum or inert atmosphere) by a hot press method. Thus, the inventors have achieved the present invention.

Hereinafter, the manufacturing method of the present invention will be described.

The manufacturing method of the invention is a method in which:

(a) a powder of fine raw material particles is used;

(b) an atmosphere is used which causes water not to be adsorbed into the raw material particle powder; and (c) the powder is sintered by a hot press method without pre-sintering the powder; and, preferably, (d) the hot press temperature at the time of the sintering is appropriately controlled.

The following will describe circumstances in which the manufacturing method of the present invention has been attained:

Firstly, in the present invention, (a) it is important to use a powder of fine raw material particles. This is based on a consideration mainly for a decrease in a $Li_4P_2O_7$ phase, which is an impurity phase, and an increase of the resultant in density (relative density). In other words, when the raw material particle powder is large in particle diameter, a dense sintered body is not obtained unless the powder is sintered at a high temperature at which the impurity phase is unfavorably produced. Thus, in the present invention, a raw material particle powder having an average particle diameter of 10 μm or less is used. The raw material particle powder, which has an average particle diameter of 10 μm or less, makes it possible to yield a sintered body having an average crystal grain diameter of 15 μm or less by the manufacturing method of the invention.

Secondly, in the present invention, (b) an atmosphere is used which causes water not to be adsorbed into the raw material particle powder. Specifically, it is important to render an atmosphere to be used an atmosphere having a dew point of −30° C. or lower until the raw material particle powder is introduced into a hot press furnace after the raw material particle powder is made fine. A $Li_3PO_4$ powder usable as the raw material has hygroscopicity. As the $Li_3PO_4$ powder is made finer, the hygroscopicity tends to be made higher. Accordingly, even when a powder of fine $Li_3PO_4$ particles is used, defects (voids) such as pores or fine cracks are unfavorably generated in the resultant sintered body in a case where the powder adsorbs water and others in atmospheric air until the powder has been sintered, so that the powder becomes high in water content by percentage. Thus, in the present invention, even when the fine raw material particle powder is used, an atmosphere is used which causes water not to be adsorbed into the powder. According to an atmosphere having a dew point of −30° C. or lower, the raw material particle powder does not absorb water. This matter makes it possible to restrain the generation of defects (voids) produced by water in the sintered body. The matter also makes it possible to make the crystal gains of the sintered body obtained by the sintering fine (average crystal grain diameter: 15 μm or less).

Thirdly, (c) the powder is sintered by a hot press method without pre-sintering the powder in the present invention. As described above, the raw material particle powder of the invention does not adsorb water; thus, it is unnecessary that before sintered, the raw material particle powder is pre-sintered to conduct treatment for removing water from the powder. It is therefore possible to sinter the fine raw material particle powder as it is, so as to prevent the crystal grains from be coarsened by pre-sintering. Additionally, in the present invention, a hot press method is adopted to render the resultant sintered body a sintered body having a high relative density. Recommendable conditions for the sintering by the hot press method are as follows: for example, an atmosphere therefor is a vacuum or inert atmosphere (for example, nitrogen or argon); the temperature is from 700 to 1000° C.; and the pressure is from 10 to 100 MPa.

In the present invention, it is preferred that (d) the hot press temperature at the time of the sintering is appropriately controlled. When the powder is sintered at high temperature, a $Li_4P_2O_7$ phase is produced. Thus, in order to restrain the production, it is preferred to sinter the powder at a temperature of 1000° C. or lower.

Hereinafter, the manufacturing method will be detailed in accordance with the order of its steps.

(Raw Material)

In order to decrease an impurity phase ($Li_4P_2O_7$ phase) in the resultant sintered body, make the density of the sintered body high, and make crystal grains constituting the sintered body fine, it is desired to use, as the raw material, a powder of fine raw material particles having an average particle diameter of 10 μm or less, preferably 8 μm or less, more preferably 6 μm or less. The lower limit of the average particle diameter of the raw material particle powder is not particularly limited. From the viewpoint of the easiness of the production of the particles, the average particle diameter is preferably 1 μm or more, more preferably 3 μm or more.

A method usable for preparing the raw material may be a known preparing method to make it possible to give a desired particle diameter (average particle diameter: 10 μm or less). For example, a Li-containing phosphoric-acid compound ($Li_3PO_4$) may be obtained by mixing lithium carbonate with phosphorous, and raising the temperature of the mixture to a predetermined temperature. Alternatively, the Li-containing phosphoric-acid compound ($Li_3PO_4$) may be obtained by raising the temperature of a precipitation yielded from an aqueous solution in which Li and P are dissolved into a predetermined temperature.

The thus obtained Li-containing phosphoric-acid compound is pulverized into a fine-particle-form in a pulverizing machine such as a ball mill to prepare a powder of raw material particles having an average particle diameter of 10 µm or less. In order to yield the fine particle powder, the pulverization over a predetermined period is required. At this time, however, a contamination may be caused from balls used for the pulverization. In order to restrain the contamination, it is desired that the powder particle diameter is small before the pulverization. When the powder is a powder obtained by raising the temperature of a precipitation obtained from an aqueous solution, a fine raw material particle powder in which such a contamination is less caused can be obtained.

(Atmosphere)

In the present invention, it is preferred to render the atmosphere used until the raw material ($Li_3PO_4$ powder) is introduced to a hot press furnace an atmosphere having a dew point of −30° C. Specifically, from a time just after the raw material particle powder, which has a size of 10 µm or less, is produced, the atmosphere is rendered an atmosphere having a dew point of −30° C. or lower. In this atmosphere, the raw material particle powder is filled into a graphite tool without being pre-sintered, and subsequently the powder is introduced into the hot press furnace. Since the inside of the hot press furnace is a vacuum or an inert atmosphere, which will also be described later, it is basically unnecessary to control the dew point after the introduction into the furnace. The reason why the powder is filled into the graphite tool without being pre-sintered is that the particle diameter may be made coarse by pre-sintering the powder.

When the raw material is stored and transported until the material is filled into the graphite tool, the raw material can be prevented from adsorbing water by packaging the material in an atmosphere having a dew point of −30° C. or lower.

(Sintering by Hot Press Method)

When the raw material is sintered, the particle powder of this raw material is first filled into the graphite tool in the above-mentioned dew-point atmosphere. In the filling into the graphite tool, the raw material particle powder may be filled directly thereinto without being pre-shaped, or may be once filled into another metallic tool, pre-shaped the powder by metallic tool-press, and then filled into the graphite tool. The pre-shaping in the latter case is performed to improve the raw material in handleability when the raw material is set into the predetermined tool in the hot press step. It is preferred to apply a pressurizing force of about 0.5 to 1.0 tonf/cm² thereto to make a pre-shaped body.

Conditions for the sintering by the hot press are controlled in a vacuum or an inert atmosphere as follows: a temperature of 700 to 1000° C.; and a pressure of 10 to 100 MPa. If the sintering temperature is lower than 700° C., the relative density of the resultant sintered body is lowered to less than 85%, so that the body comes to be easily cracked when used to conduct sputtering. By contrast, if the sintering temperature is higher than 1000° C., the sintered body becomes large in average particle diameter, and cannot keep an impurity phase ($Li_4P_2O_7$ phase) therein at a low proportion so that the intensity ratio (P314/P427) falls below 1.1. In order to decrease the proportion of the impurity phase, the sintering temperature is preferably from 900 to 950° C. both inclusive.

Similarly, if the pressure at the time of the sintering is less than 10 MPa, the sintered body is lowered in relative density not to gain a desired relative density. By contrast, if the pressure at the time of the sintering is more than 100 MPa, for example, the graphite tool is broken, so that the hot press is not easily attained. The pressure is more preferably from 20 to 50 MPa.

The purpose of sintering the powder in the vacuum or inert atmosphere is to prevent the raw material particle powder introduced in the furnace from adsorbing water, and further restrain the oxidization or loss of graphite of the graphite tool used in the present invention. The gas used in the inert atmosphere is, for example, an inert gas such as Ar or $N_2$. The method for controlling the atmosphere is not particularly limited, and may be, for example, a method of introducing Ar gas or $N_2$ gas into the furnace to adjust the atmosphere.

In a case where the sintering temperature reaches into a highest-temperature range at the time of the sintering, the raw material may be retained at a predetermined temperature. The retention period in this case is varied in accordance with the temperature and the pressure at the time of the sintering, and other factors. In general, the period is preferably 100 hours or less. If the retention period is more than 100 hours, the raw material is remarkably decreased in weight by the sintering, not to give a good sintered body (in particular, a sintered body having a high relative density). The retention period may be zero (the raw material is not retained at the predetermined temperature). For example, when the sintering temperature is set into an optimal range in the light of a relationship with the raw material or others, the retention period may be zero.

The oxide sintered body yielded as described above has a high relative density and a fine average crystal grain diameter, and further has no defects (voids). Additionally, the appropriate control of the sintering temperature makes the resultant sintered body low in impurity phase proportion.

Furthermore, by subjecting the oxide sintered body to "working→bonding" in any usual manner, the sputtering target of the present invention is obtained. The thus obtained sputtering target also has a high relative density and a fine average crystal grain diameter, and further has no defects (voids). Preferably, the sputtering target is also low in impurity phase proportion, and is a very good product, equivalently to the sintered body.

(Li-Containing Phosphoric-Acid Compound Sintered Body of the Invention)

The Li-containing phosphoric-acid compound sintered body of the present invention is a body in which: (1) the average crystal grain diameter is 15 µm or less, (2) there are no defects (voids) having a size of 50 µm or more in any cross section of the inside of the body, and (3) the relative density is 85% or more; and preferably (4) the intensity ratio of the $Li_3PO_4$ phase to the $Li_4P_2O_7$ phase (P314/P427) according to powder X-ray diffraction is 1.1 or more.

In the Li-containing phosphoric-acid compound sintered body of the present invention, (1) the average crystal grain diameter is 15 µm or less. If the average crystal grain diameter is more than 15 µm, abnormal discharge or nodules are frequently generated while a target obtained using the sintered body is sputtered. The average crystal grain diameter is preferably 12 μm or less, more preferably 10 μm or less. As the average crystal grain diameter of the sintered body is finer, the sputtering can be more stably attained. Thus, the lower limit thereof is not limited provided that the average crystal grain diameter is preferably 3 μm or more, more preferably 5 μm or more from the viewpoint of the easiness of the production thereof.

Furthermore, (2) there are no defects (voids) having a size of 50 μm or more in any cross section of the inside of the the sintered body. If a defect having a size of 50 μm or more is generated in the sintered body, abnormal discharge may be generated at the time of the sputtering. A void judged to be a defect is measurable through an SEM photograph of a vertical cross section of the sintered body. Specifically, any region of a vertical cross section of the sintered body is observed through an SEM, and defects (void) are each specified through an SEM photograph thereof. The length (maximum diameter) of each of the defects is measured. The sintered body of the present invention is a sintered body containing, in a 1-mm$^2$ area thereof, no defects having a size of 50 μm or more.

Additionally, (3) the relative density of the sintered body is 85% or more. By making the relative density high, the film-forming electric power at the time of the sputtering can be increased. Thus, the film-forming speed is also improved so that films to be obtained are made high in productivity. However, if the relative density is less than 85%, the target may be cracked or broken during the sputtering. The relative density is preferably 90% or more, more preferably 95% or more, even more preferably 98% or more.

When the sintered body of the present invention satisfies the requirements (1) to (3), the above-mentioned intended object can be attained. It is desired that (4) the intensity ratio of a $Li_3PO_4$ phase therein to a $Li_4P_2O_7$ phase therein (P314/P427) according to powder X-ray diffraction is 1.1 or more. When the intensity ratio of the $Li_3PO_4$ phase to the $Li_4P_2O_7$ phase is 1.1 or more, the resultant sintered body is even to give an improved film-forming stability. Furthermore, a Li-containing phosphoric-acid compound film obtained by the film formation is also improved in properties as a solid electrolyte film.

In order to calculate the the intensity ratio of the $Li_3PO_4$ phase to the $Li_4P_2O_7$ phase, the following are first shown in an XRD chart: the powder X-ray diffraction intensity (P314) of a (011) plane of the $Li_3PO_4$ phase to the diffraction intensity (P427) of a (1-11) plane of the $Li_4P_2O_7$ phase. Next, on the basis of this chart, the intensity ratio P314/P427 is calculated. The intensity ratio P314/P427 is preferably 1.5 or more, more preferably 2.0 or more, and is preferably 5.0 or less, more preferably 4.0 or less, even more preferably 3.0 or less.

(Sputtering Target)

The present invention also includes, in the scope thereof, any sputtering target (Li-containing phosphoric-acid compound sintered body target) obtained using the above-mentioned sintered body. The method for manufacturing the sputtering target is not particularly limited, and may be an ordinarily used method. The thus obtained sputtering target gains the same properties as gained by the above-mentioned Li-containing phosphoric-acid compound sintered body (a high relative density, no void, and a fine average crystal grain diameter; and preferably a low impurity phase proportion).

The present application claims the benefit of a priority based on Japanese Patent Application No. 2012-090543 filed on Apr. 11, 2012. The entire contents in the specification of the Japanese Patent Application No. 2012-090543 are incorporated herein by reference.

EXAMPLES

Hereinafter, the present invention will be more specifically described by way of working examples thereof. However, the present invention is never limited by the examples. Of course, the examples may each be carried out in the state of adding an appropriate modification thereto as far as the resultant conforms to the subject matters of the invention that have been described hereinbefore or will be described hereinafter. All the resultant modified examples are included in the technical scope of the present invention.

Experiment 1

(Production of Li-Containing Phosphoric-Acid Compound Sintered Bodies)

As each raw material particle powder, a $Li_3PO_4$ particle powder was used (purity: 99.9% or more, average particle diameter: each "particle diameter" described in Table 1).

The individual raw material particle powders were set directly into graphite tools, respectively, and then sintered by hot press under respective conditions shown in Table 1. In this way, sintered bodies were obtained. About each of Nos. 1 to 6, and 8, an atmosphere having a dew point of −30° C. or lower was used until the raw material particle powder was set to one of the graphite tools and then introduced into a hot press furnace. About each of Nos. 1 to 7, the sintering was performed without performing pre-sintering. About No. 7, the dew point of an atmosphere therefor was not controlled, so that the powder was set to one of the graphite tools in the atmosphere that was an atmosphere having a dew point higher than −30° C. This graphite tool was then introduced into a hot stamping furnace. About No. 8, the powder was pre-sintered at 750° C. in the atmospheric air for 3 hours before set into one of the graphite tools.

(Measurement of Relative Densities of Sintered Bodies)

The respective relative densities of the above-mentioned sintered bodies were measured by the Archimedes method.

(Measurement of Intensity Ratio about Each of Sintered Bodies According to Powder X-Ray Diffraction)

A powder X-ray diffraction using a CuKα ray was used to measure the diffraction intensity (P314) of a (011) plane of a $Li_3PO_4$ phase in each of the sintered bodies, and the diffraction intensity (P427) of a (1-11) plane of a $Li_4P_2O_7$ phase therein. From the resultant X-ray diffraction chart, the intensity ratio (P314/P427) was calculated out.

(Measurement of Average Crystal Grain Diameter of Each of Sintered Bodies)

A scanning electron microscope (SEM) was used to observe any position of a vertical cross section of each of the sintered bodies, and the average crystal grain diameter was analyzed by a cutting method through a photograph of a cut surface thereof (SEM photograph, viewing field size: 150× 220 μm).

(Measurement of the Number of Defects in Each of Sintered Bodies)

In any 1-mm$^2$ region of the SEM photograph of the vertical cross section of each of the sintered bodies, the respective maximum diameters of defects (voids) were analyzed from the scale. Through visual observation thereof, the number of defects having a maximum diameter of 50 μm or more, out of the defects, was measured.

These results are shown in Table 2.

TABLE 1

| No. | Raw material particle powder Average particle diameter (μm) | Conditions before sintering Dew point control | Pre-sintering | Conditions for sintering by hot press Atmosphere | Temperature (° C.) | Retention period (hr) | Surface pressure (MPa) |
|---|---|---|---|---|---|---|---|
| 1 | 5 | Made | Not performed | $N_2$ | 850 | 1.5 | 29.4 |
| 2 | 5 | Made | Not performed | $N_2$ | 850 | 1.5 | 29.4 |
| 3 | 5 | Made | Not performed | $N_2$ | 870 | 1.5 | 29.4 |
| 4 | 5 | Made | Not performed | $N_2$ | 920 | 1.5 | 29.4 |
| 5 | 30 | Made | Not performed | $N_2$ | 1050 | 1.5 | 29.4 |
| 6 | 30 | Made | Not performed | $N_2$ | 870 | 1.5 | 29.4 |
| 7 | 5 | Not made | Not performed | $N_2$ | 870 | 1.5 | 29.4 |
| 8 | 5 | Made | Performed | $N_2$ | 870 | 1.5 | 29.4 |

TABLE 2

| No. | Sintered bodies Average crystal grain diameter (μm) | Relative density (%) | The number (/mm²) of defects | Target No. |
|---|---|---|---|---|
| 1 | 7 | 76.6 | 0 | A |
| 2 | 10 | 96 | 0 | — |
| 3 | 12 | 98 | 0 | B |
| 4 | 14 | 97.2 | 0 | — |
| 5 | 35 | 98.6 | 0 | C |
| 6 | 33 | 82 | 0 | — |
| 7 | 10 | 93.4 | 2 | D |
| 8 | 25 | 98 | 0 | E |

According to Tables 1 and 2, a consideration can be made as follows:

Nos. 2 to 4 in Table 1 are Li-containing phosphoric-acid compound sintered bodies manufactured by the manufacturing method defined in the present invention. These samples Nos. 2 to 4 did not have any defect (void) having a size of 50 μm or more, which is prescribed in the present invention, and had an average crystal grain diameter of 15 μm or less, and a high relative density of 85% or more. The respective intensity ratios (P314/P427) of No. 2, No. 3, and No. 4 were 1.2, 1.5, and 2.9, which satisfied the preferred prescription in the present invention.

By contrast, about No. 1 in Table 1, the sintering temperature was low so that the relative density was lowered. About No. 5, the sintering temperature was high so that the sintered body gained a high relative density. However, the average particle diameter of the powdery raw material was large so that the sintered body did not satisfy the average crystal grain diameter prescribed in the present invention. About No. 6, the powdery raw material was large in average particle diameter so that the sintered body did not satisfy the average crystal grain diameter prescribed in the invention. About No. 7, the dew point was not controlled so that defects having a size of 50 μm or more were generated. No. 8 did not satisfy the average crystal grain diameter prescribed in the invention since the powder was pre-sintered.

Experiment 2

(Production of Sputtering Targets)

The sintered bodies Nos. 1, 3, 5, 7 and 8 were used to manufacture sputtering targets, respectively. The sputtering targets were yielded by subjecting the respective sintered bodies to mechanical working, so as to be each finished into a piece having a diameter of 4 inches and a thickness (t) of 5 mm, and using indium to bond the piece onto a backing plate made of Cu. The sputtering targets yielded using Nos. 1, 3, 5, 7 and 8, respectively, are called targets A to E, respectively.

Next, the targets A to E were used to make the following film-forming experiment.

Film-forming apparatus: an RF magnetron sputtering apparatus was used.

Film-forming conditions: substrate temperature: room temperature; RF discharge power: 600 W; sputtering gas pressure: 3 mTorr; used sputtering gas: a mixed gas of Ar and nitrogen; and thickness of the formed film: 500 nm.

Film-Forming Steps:

Each of the targets was set to the sputtering apparatus, and a glass substrate was fitted onto a substrate stage opposed to the target. The inside of its chamber was subjected to vacuum-drawing into a vacuum having a pressure of $5 \times 10^{-4}$ Pa or less through a vacuum pump. The substrate temperature was adjusted to room temperature. Next, a mass flow was used to supply the above-mentioned sputtering gas into the chamber. The sputtering gas pressure was adjusted into 3 mTorr, and then an RF (alternating current) was used to apply a high voltage to the target to generate a plasma discharge. The discharge power at this time was 600 W, and the film was formed to give a film thickness of 500 nm.

As a result, about the target A, which had a low relative density (relative density: 76.6%), the target was broken in the middle of the film-formation. About the target C, which had a large average crystal grain diameter (average crystal grain diameter: 35 μm), the target D, which had defects (the number of the defects: 2), and the target E, which had a large average crystal grain diameter (average crystal grain diameter: 25 μm), abnormal discharge was generated in the middle of the film-formation so that a stable discharge maintenance did not succeed.

By contrast, the target B, which satisfied all the requirements of the present invention, was not broken in the middle of the film-formation so that a stable discharge maintenance succeeded.

According to the above-mentioned results, the following advantageous effects were verified by using a Li-containing phosphoric-acid compound sintered body and a sputtering target each satisfying the requirements of the present invention: by a sputtering method, a Li-containing phosphoric-acid compound thin film, which is useful for an electrolyte thin film for a Li-based secondary battery and others, can be formed stably at a high film-forming speed without breaking a target therefor or generating abnormal discharge. Thus, the use of the sputtering target is very useful since the thin film can be supplied at a high-forming rate.

The invention claimed is:

1. A sintered body, comprising
a Li-containing phosphoric acid compound,
wherein the sintered body
contains no voids in a size of 50 μm or more in any region of a cross sectional area of 1 mm² inside the body,
has an average crystal grain diameter of 15 μm or less,
has a relative density of 85% or more, and
has an intensity ratio of P314/P427 satisfying 1.1≤P314/P427≤5.0, where P314 is a diffraction intensity of a (011) plane of a $Li_3PO_4$ phase in the sintered body measured by powder X-ray diffraction and P427 is a diffraction intensity of a (1-11) plane of a $Li_4P_2O_7$ phase in the sintered body measured by the powder X-ray diffraction.

2. The sintered body according to claim 1, wherein the intensity ratio of
P314/P427 satisfies 1.5≤P314/P427≤5.0.

3. A sputtering target, obtained from the sintered body according to claim 1.

4. A sputtering target, obtained from the sintered body according to claim 2.

5. A method for manufacturing the sintered body according to claim 1, the method comprising
retaining a raw material containing a Li-containing phosphoric-acid compound having an average grain diameter of 10 μm or less in an atmosphere having a dew point of −30° C. or lower; then
introducing the raw material into a hot press furnace without being pre-sintered; and then
sintering the raw material by a hot press method.

6. The method according to claim 5, wherein the sintering by the hot press method is performed in a vacuum or an inert atmosphere at a hot press temperature of 700 to 1000° C. under a pressure of 10 to 100 MPa.

7. The sintered body according to claim 1, which has an average crystal grain diameter of 3 μm or more.

8. The sintered body according to claim 1, which has a relative density of 85% or more and less than 98%.

9. The method according to claim 5, wherein the raw material has an average grain diameter of 1 μm or more.

10. The method according to claim 6, wherein the hot press temperature ranges from 900 to 950° C.

11. The method according to claim 6, wherein the pressure ranges from 20 to 50 MPa.

* * * * *